(12) United States Patent
Muramatsu et al.

(10) Patent No.: US 10,205,010 B2
(45) Date of Patent: Feb. 12, 2019

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Toru Muramatsu, Matsumoto (JP); Hong-fei Lu, Hino (JP); Haruo Nakazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/983,040

(22) Filed: May 17, 2018

(65) Prior Publication Data

US 2018/0269314 A1 Sep. 20, 2018

Related U.S. Application Data

(63) Continuation of application No. 15/232,825, filed on Aug. 10, 2016, now Pat. No. 10,026,831.

(30) Foreign Application Priority Data

Aug. 18, 2015 (JP) .................. 2015-161022
Jun. 22, 2016 (JP) .................. 2016-123882

(51) Int. Cl.
*H01L 29/66* (2006.01)
*H01L 29/739* (2006.01)
(Continued)

(52) U.S. Cl.
CPC ...... *H01L 29/7395* (2013.01); *H01L 21/2253* (2013.01); *H01L 21/26506* (2013.01);
(Continued)

(58) Field of Classification Search
CPC ............ H01L 29/7395; H01L 29/0619; H01L 29/417; H01L 29/66333; H01L 29/1095; H01L 21/26506
See application file for complete search history.

(56) References Cited

U.S. PATENT DOCUMENTS 5,444,271 A 8/1995 Kuwahara
8,084,814 B2 * 12/2011 Nemoto ............. H01L 29/32
257/330

(Continued)

FOREIGN PATENT DOCUMENTS

JP H0669509 A 3/1994
JP 2001196320 A 7/2001

(Continued)

*Primary Examiner* — Mark Tornow

(57) ABSTRACT

A semiconductor device is provided, the semiconductor device including a base layer of a first conductivity type having a MOS gate structure formed on a front surface side thereof, a collector layer of a second conductivity type formed on a rear surface side of the base layer, and into which a first dopant and a second dopant which is different from the first dopant are implanted, and a collector electrode formed on a rear surface side of the collector layer, wherein an impurity concentration peak of the second dopant is at a deeper position from the rear surface of the collector layer than an impurity concentration peak of the first dopant, and magnitude of the impurity concentration peak of the second dopant is larger than $1/100$ of magnitude of the impurity concentration peak of the first dopant.

9 Claims, 12 Drawing Sheets

(51) Int. Cl.
  *H01L 21/265* (2006.01)
  *H01L 29/417* (2006.01)
  *H01L 29/06* (2006.01)
  *H01L 21/225* (2006.01)
  *H01L 29/10* (2006.01)

(52) U.S. Cl.
  CPC ........ *H01L 29/0619* (2013.01); *H01L 29/417* (2013.01); *H01L 29/66333* (2013.01); *H01L 29/1095* (2013.01)

(56) References Cited

U.S. PATENT DOCUMENTS

| | | | |
|---|---|---|---|
| 9,070,737 B2 * | 6/2015 | Lu ....................... | H01L 29/0619 |
| 2002/0100934 A1 * | 8/2002 | Nakagawa .......... | H01L 29/0834 257/330 |

FOREIGN PATENT DOCUMENTS

| JP | 200686414 A | 3/2006 |
|---|---|---|
| JP | 2006324431 A | 11/2006 |
| JP | 2006351659 A | 12/2006 |
| JP | 4882214 B2 | 2/2012 |
| JP | 5011634 B2 | 8/2012 |

* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation of U.S. patent application Ser. No. 15/232,825, filed on Aug. 10, 2016, which claims priority to Japanese Patent Application No. 2015-161022, filed on Aug. 18, 2015, and Japanese Patent Application No. 2016-123882, filed on Jun. 22, 2016, the contents of each of which are hereby incorporated herein by reference in their entirety.

BACKGROUND

1. Technical Field

The present invention relates to a semiconductor device and a method of manufacturing the semiconductor device.

2. Related Art

Conventionally, an insulated-gate bipolar transistor (IGBT) is known, that is a power semiconductor device used for power conversion apparatus or the like and that has a reverse breakdown voltage (for example, Patent Document 1). A technique in which a collector layer is formed by impurity implantation is also known in the semiconductor device (for example, Patent Documents 2 and 3).

PRIOR ART DOCUMENTS

Patent Document 1: Japanese Patent Application Publication No. 2006-86414
Patent Document 2: Japanese Patent Application Publication No. 2006-351659
Patent Document 3: Japanese Patent Application Publication No. 2001-196320

There are cases in which in the IGBT, a strong electric field acts on a p-n junction between an n type drift region and a p type collector region on a rear surface side at the time when a reverse bias is applied. For this reason, if there is a defect at the p-n junction portion, a reverse breakdown voltage lowers.

SUMMARY

Therefore, it is an object of an aspect of the innovations herein to provide a semiconductor device and a method of manufacturing the semiconductor device, which are capable of overcoming the above drawbacks accompanying the related art. The above and other objects can be achieved by combinations described in the claims. A first aspect of the innovations may include a semiconductor device including a base layer of a first conductivity type having a MOS gate structure formed on a front surface side thereof, a collector layer of a second conductivity type formed on a rear surface side of the base layer, and into which a first dopant and a second dopant which is different from the first dopant are implanted, and a collector electrode formed on a rear surface side of the collector layer, wherein an impurity concentration peak of the second dopant is at a deeper position from the rear surface of the collector layer than an impurity concentration peak of the first dopant, and magnitude of the impurity concentration peak of the second dopant is larger than $1/100$ of magnitude of the impurity concentration peak of the first dopant.

A second aspect of the innovations may include a manufacturing method, including forming a base layer of a first conductivity type having a MOS gate structure formed on a front surface side thereof, forming, on a rear surface side of the base layer, a collector layer of a second conductivity type into which a first dopant and a second dopant which is different from the first dopant are implanted, and forming a collector electrode on a rear surface side of the collector layer, wherein an impurity concentration peak of the second dopant is at a deeper position from the rear surface of the collector layer than an impurity concentration peak of the first dopant, and magnitude of the impurity concentration peak of the second dopant is larger than $1/100$ of magnitude of the impurity concentration peak of the first dopant.

The summary clause does not necessarily describe all necessary features of the embodiments of the present invention. The present invention may also be a sub-combination of the features described above.

DESCRIPTION OF EXEMPLARY EMBODIMENTS

The embodiments do not limit the invention according to the claims, and all the combinations of the features described in the embodiments are not necessarily essential to means provided by aspects of the invention.

Figure 1:
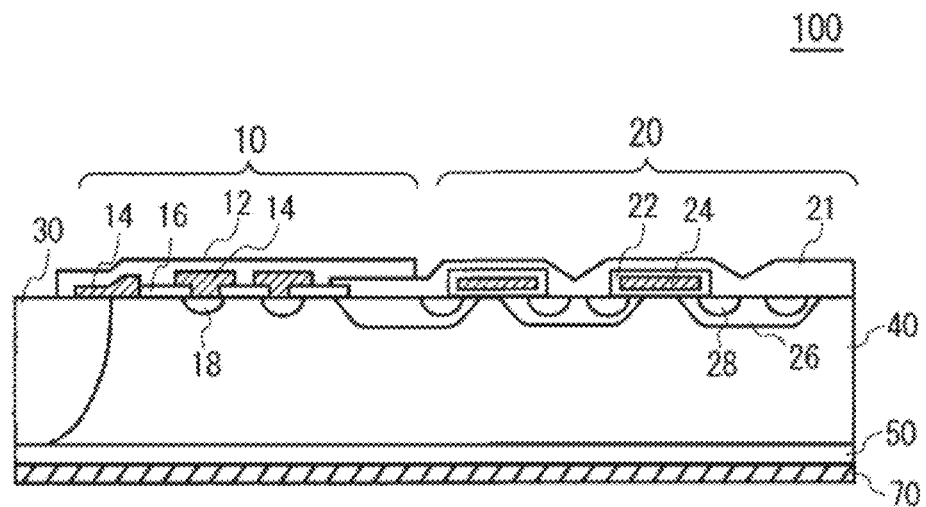
FIG. 1 shows a configurational example of a semiconductor device 100.

FIG. 1 shows a configurational example of a semiconductor device 100. FIG. 1 shows a cross-section of the semiconductor device 100. The semiconductor device 100 is an IGBT having a MOS gate structure on its front surface side, and a p-n junction on its rear surface side. The semiconductor device 100 of the present example comprises a MOS gate structure 20, an edge termination structure 10, a separation layer 30, a base layer 40, a collector layer 50, and a collector electrode 70. The semiconductor device 100 is one example of a reverse blocking type IGBT having breakdown voltages in both a forward direction and a reverse direction.

The base layer 40 is a semiconductor layer of a first conductivity type having the MOS gate structure 20 formed on a front surface side thereof. The base layer 40 of the present example is an n− type silicon layer. When the semiconductor device 100 is of a non-punch through type, the base layer 40 has a thickness that does not allow a depletion layer in the p-n junction with a p region on the front surface side to reach the collector layer 50.

The MOS gate structure 20 has an emitter electrode 21, an insulating film 22, a gate electrode 24, a second conductivity type region 26 and a first conductivity type region 28. In the present example, the first conductivity type region 28 is an n+ type region formed on the front surface side of the base layer 40. Also, the second conductivity type region 26 is a p type region that surrounds the first conductivity type region 28 and is formed to separate the first conductivity type region 28 from the base layer 40. When a predetermined voltage is applied to the gate electrode 24, a channel is formed in the second conductivity type region 26 immediately below the gate electrode 24, and the first conductivity type region 28 and the base layer 40 become conductive. Thereby, the MOS gate structure 20 operates as a MOSFET.

The collector layer 50 has the second conductivity type, and is formed on the rear surface side of the base layer 40. The rear surface of the base layer 40 refers to a surface that is opposite to the front surface on which the MOS gate structure 20 is formed. The collector layer 50 of the present example is a p− type silicon layer. The collector layer 50 may be formed to contact the rear surface of the base layer 40. In addition, the base layer 40 and the collector layer 50 are formed of the same material (silicon in the case of the present example).

The collector electrode 70 is formed on the rear surface side of the collector layer 50. The rear surface of the collector layer 50 refers to a surface on the opposite side of a surface contacting the base layer 40. The collector electrode 70 is formed by vapor-depositing or sputtering, for example, aluminum on the rear surface side of the collector layer 50.

The separation layer 30 has the second conductivity type, and is formed from the front surface of the base layer 40 to the front surface of the collector layer 50 (that is, the rear surface of the base layer 40). The separation layer 30 of the present example is of a p+ type. Also, the separation layer 30 is provided, on the front surface side of the base layer 40, to surround the MOS gate structure 20. For example, the separation layer 30 is formed on a side surface of the semiconductor device 100. The side surface of the semiconductor device 100 may be a dicing surface that is formed when the semiconductor device 100 is cut out from a wafer. Thereby, the base layer 40 of the first conductivity type can be prevented from being exposed to the side surface of the semiconductor device 100 and the depletion layer can be prevented from being exposed to the side surface of the semiconductor device 100, so the reverse breakdown voltage can be ensured.

The edge termination structure 10 is provided on the front surface side of the base layer 40 and between the MOS gate structure 20 and the separation layer 30. The edge termination structure 10 has one or more regions 18, one or more electrodes 14, one or more insulating films 16 and a protective film 12. The regions 18 are regions of the second conductivity type formed in the base layer 40. A depletion layer formed between the regions 18 and the base layer 40 couples with a depletion layer between the second conductivity type region 26 of the MOS gate structure 20 and the base layer 40. Thereby, an end portion of the depletion layer can be arranged in the edge termination structure 10 which is on the outer side of the MOS gate structure 20, and thus the breakdown voltage of the MOS gate structure 20 can be maintained. The electrodes 14 are connected with the regions 18 that are not covered with the insulating film 16. By applying a voltage to the electrodes 14, the width of the depletion layer between the region 18 and the base layer 40 can be adjusted.

Normally, in a non-punch-through type IGBT, a p type collector layer is formed by grinding an n− type substrate formed from an FZ crystal, and then implanting boron ions onto the rear surface side of the substrate and performing laser annealing or the like. Generally, the p type collector layer is formed to be very thin. For example, when a laser with a wavelength of 532 nm is used in laser annealing, the thickness of the p type collector layer is approximately 0.25 µm. Because, as described above, a normal collector layer is very thin, when a scratch occurs on the rear surface side of the collector layer or an alloy spike from the collector electrode occurs during a wafer process or a module assembling step, such a scratch, spike or the like easily penetrates the collector layer. If a spike or the like penetrates the collector layer and reaches the p-n junction, reverse leakage current increases.

In contrast, the semiconductor device 100 is provided with the collector layer 50 having a thickness of 0.5 µm or more, preferably 0.75 µm or more. Thereby, a scratch, a spike or the like can be prevented from reaching the p-n junction portion between the collector layer 50 and the base layer 40. Accordingly, reverse leakage current can be reduced, and the reverse breakdown voltage can be improved. As one example, the semiconductor device 100 can be used for uses such as a matrix converter that requires a reverse breakdown voltage.

Figure 2:
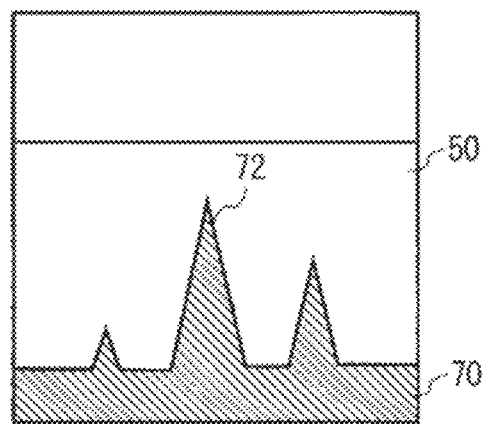
FIG. 2 shows one example of an alloy spike 72.

FIG. 2 shows one example of an alloy spike 72. FIG. 2 shows cross-sections of the collector electrode 70 and the collector layer 50. The alloy spike 72 is formed by a metal of the collector electrode 70 being alloyed with the semiconductor of the collector layer 50, and penetrating the inner part of the collector layer 50 in a spike-like form. As described above, it is possible to prevent the alloy spike 72 from reaching the p-n junction portion by setting the thickness of the collector layer 50 to 0.5 µm or more, preferably 0.75 µm or more. Also, the thickness of the collector layer 50 may be 0.75 µm or more and 2.0 µm or less, and preferably, 1 µm or more and 1.5 µm or less.

Figure 3:
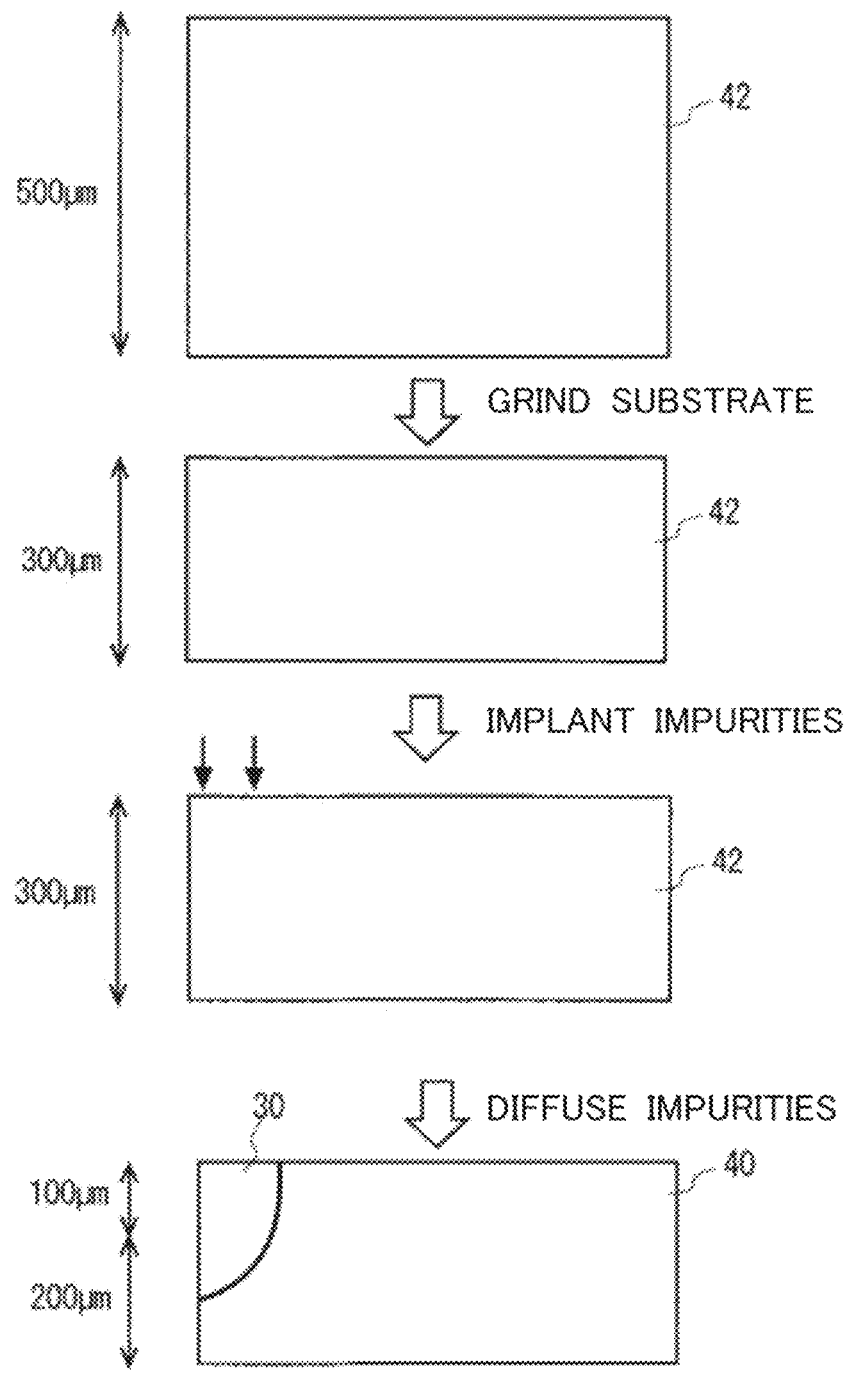
FIG. 3 shows one example of a step of manufacturing the semiconductor device 100.

FIG. 3 shows one example of a step of manufacturing the semiconductor device 100. FIG. 3 shows cross-sections of respective members. First, a base substrate 42 of the first conductivity type is prepared. The base substrate 42 may be a substrate that is cut out from an FZ crystal manufactured by a floating zone method.

Next, at a substrate grinding step, the base substrate 42 is ground to a predetermined thickness. In the present example, the 500-μm base substrate 42 is ground to 300 μm. The thickness after grinding may be determined according to the breakdown voltage the semiconductor device 100 should have. For example, if the class of breakdown voltage is 600 V or 1200 V, the base substrate 42 is ground to thicknesses of approximately 280 μm and 380 μm, respectively.

Next, at an impurity implantation step, impurities are implanted to the base substrate 42. A mask oxidation film having a predetermined pattern is formed on the base substrate 42, and the front surface of the base substrate 42 that corresponds to the separation layer 30 is exposed. Then, impurities corresponding to the second conductivity type are implanted selectively to the exposed front surface of the base substrate 42. The impurities are implanted for example to surround a predetermined region along a dicing line. Impurities at a concentration of approximately $5.0 \times 10^{15}$ cm$^{-2}$ are implanted to the front surface side of the base substrate 42. Impurities at a dosage from approximately $1 \times 10^{15}$ cm$^{-2}$ to $5 \times 10^{15}$ cm$^{-2}$ may be implanted to the front surface side of the base substrate 42. In FIG. 3, ranges in which impurities are implanted are indicated with arrows.

Next, in an impurity diffusion step, a diffusion process is performed on the impurities that are implanted on the front surface side of the base substrate 42. Diffusion of the impurities may be performed by annealing the base substrate 42. In the present example, the base substrate 42 is annealed for example at 1300° C. for 100 hours. The temperature and duration of annealing can be adjusted depending on the thickness of the separation layer 30 that should be formed, the concentration of implanted impurities, or the like. Thereby, the separation layer 30 of the second conductivity type that is diffused from the front surface of the base layer 40 is formed. In addition, when a resist for protection is applied onto the front surface side of the base layer 40, the resist is removed before annealing.

Figure 4:
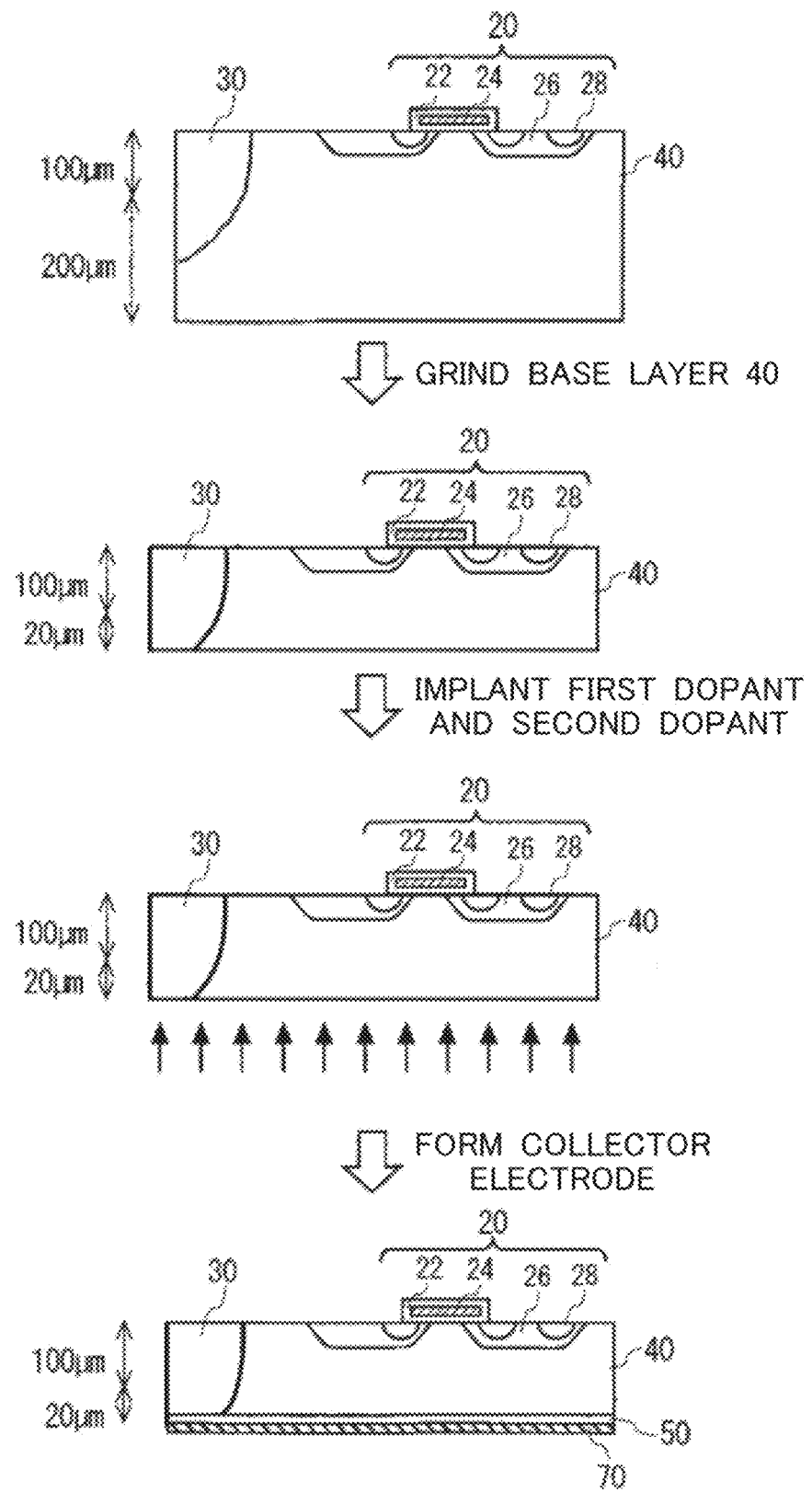
FIG. 4 shows the continuation of the step of manufacturing the semiconductor device 100.

FIG. 4 shows the continuation of the step of manufacturing the semiconductor device 100. After the impurity diffusion step shown in FIG. 3, in a MOS forming step, the MOS gate structure 20 is formed in a region on the front surface side of the base layer 40 and surrounded by the separation layer 30. Next, in a grinding step, the rear surface of the base layer 40 is ground to adjust the thickness of the base layer 40. The thickness of the base layer 40 after grinding may be determined depending on the class of breakdown voltage the semiconductor device 100 is required to have. For example, for the class of breakdown voltage of 600 V, grinding is performed such that the sum of the thicknesses of the base layer 40 and the collector layer 50 is approximately 100 μm, and for the class of breakdown voltage of 1200 V, the sum of the thicknesses of the final base layer 40 and the collector layer 50 is approximately 200 μm. Grinding of the base substrate 42 may be performed for example by using techniques such as mechanical grinding or chemical etching.

Next, in a first dopant and second dopant implantation step, impurities corresponding to the second conductivity type are implanted to the rear surface side of the base substrate 42 after grinding. Also, the implanted impurities are activated by performing laser annealing or the like on the rear surface side of the collector layer 50. For example, the collector layer 50 is formed such that an impurity concentration peak of the second dopant is at a deeper position from the rear surface of the collector layer 50 than an impurity concentration peak of the first dopant, and magnitude of the impurity concentration peak of the second dopant is larger than 1/100 of magnitude of the impurity concentration peak of the first dopant. In addition, the magnitude of the impurity concentration peak of the second dopant may be larger than 1/10 of the magnitude of the impurity concentration peak of the first dopant, and may also be larger than 1/2 of the magnitude of the impurity concentration peak of the first dopant. Also, the magnitude of the impurity concentration peak of the second dopant may be larger than the magnitude of the impurity concentration peak of the first dopant. In addition, it is preferable that a diffusion coefficient of the first dopant is lower than a diffusion coefficient of the second dopant.

Next, in a collector electrode forming step, the collector electrode 70 is formed on the rear surface side of the collector layer 50. For example, a metal such as aluminum is sputtered or vapor-deposited on the rear surface side of the collector layer 50 to form the collector electrode 70.

Example 1

Figure 5:
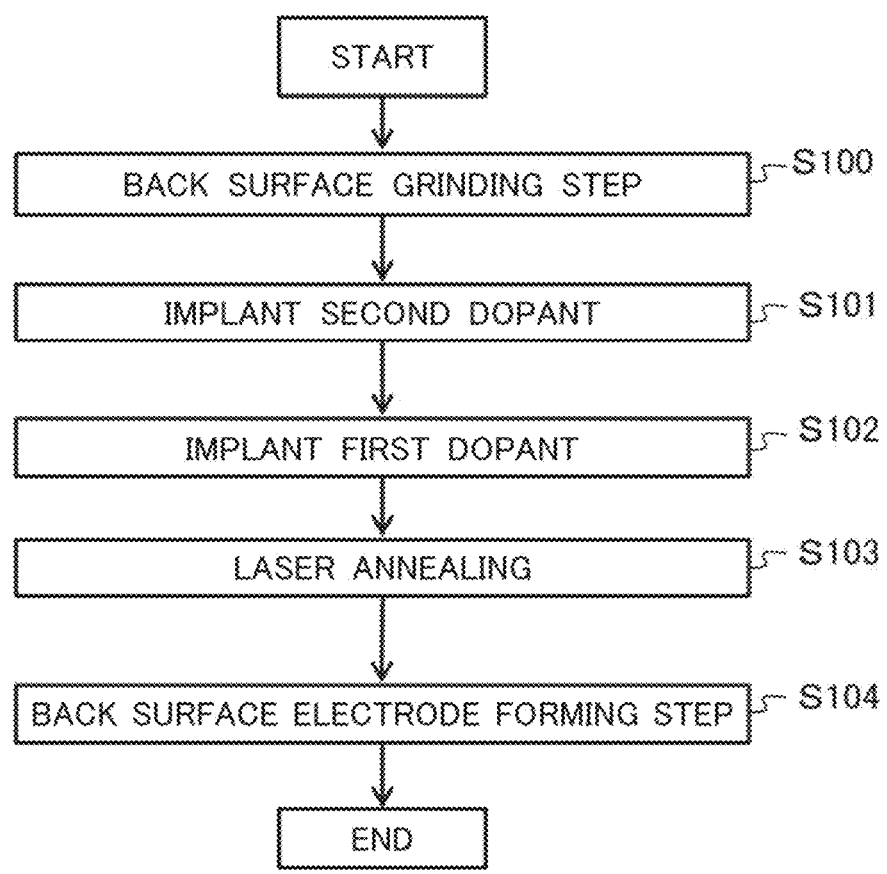
FIG. 5 shows one example of a step of manufacturing a collector layer 50 according to Example 1.

FIG. 5 shows one example of a step of manufacturing the collector layer 50 according to Example 1. In the present example, the step of manufacturing the collector layer 50 is shown in more detail.

In step S100, the rear surface of the base substrate 42 is ground to form the base substrate 42 of a predetermined thickness. At this time, the thickness of the base substrate 42 may be set such that it becomes the sum total of the thicknesses of the base layer 40 and the collector layer 50. In step S101, the second dopant is ion-implanted. In the present example, as the second dopant, aluminum is ion-implanted at a dosage of $1.0 \times 10^{13}$ cm$^{-2}$ and an accelerating voltage of 150 keV. In step S102, the first dopant is ion-implanted. An accelerating voltage of the first dopant may be lower than the accelerating voltage of the second dopant. In the present example, as the first dopant, boron is ion-implanted at a dosage of $1.0 \times 10^{13}$ cm$^{-2}$ and an accelerating voltage of 45 keV. By making the impurity concentration of the first dopant high, the contact resistance with the collector electrode 70 can be lowered. In step S103, laser annealing is performed from the rear surface side of the collector layer 50. A laser with a wavelength of 750 nm or more is used in laser annealing. More preferably, a laser with a wavelength of 800 nm or more is used. After that, in step S104, the collector electrode 70 is formed on the rear surface side of the collector layer 50.

Figure 6:
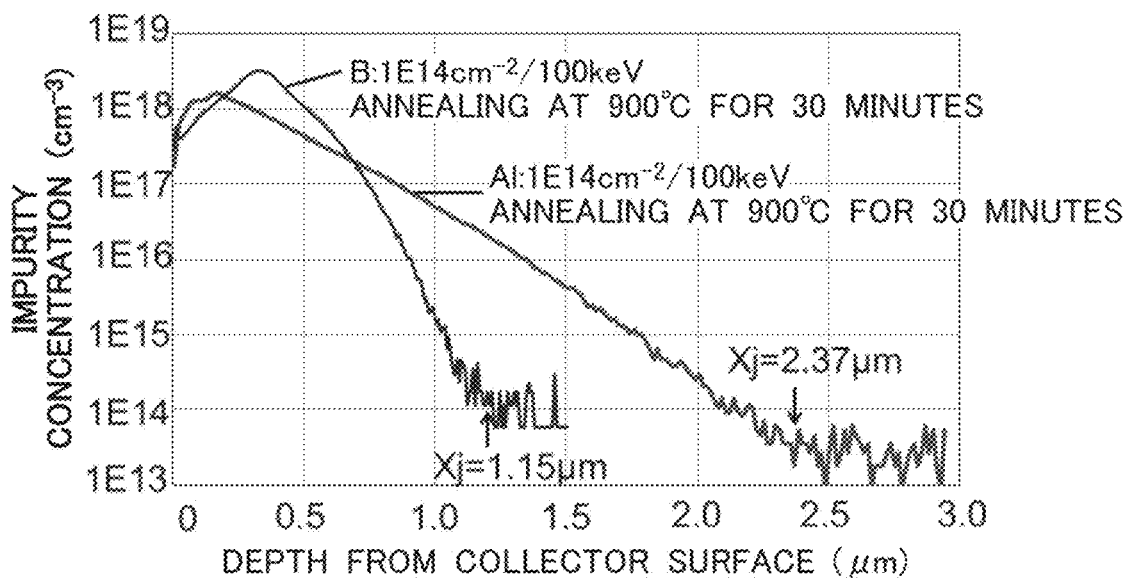
FIG. 6 shows an SIMS analysis result of impurity concentration distributions of boron and aluminum.

FIG. 6 shows an SIMS analysis result of impurity concentration distributions of boron and aluminum. The longitudinal axis shows an impurity concentration (cm$^{-3}$), and the horizontal axis shows a depth (μm) from the ion implantation surface of the collector layer 50. In the present example, the ion implantation surface refers to the surface through which the dopants are ion-implanted. The impurity concentration distributions of the present example are impurity concentration distributions showing a case in which boron and aluminum are ion-implanted into a silicon wafer.

The dopants of the present example are ion-implanted at the same dosage and the same accelerating voltage, and are laser-annealed under the same conditions. That is, a difference in the diffusion coefficients between boron and aluminum can be found by comparing the impurity concentration distributions of boron and aluminum which are ion-implanted and diffused under the same conditions. The dosage of the present example is $1.0 \times 10^{14}$ cm$^{-2}$ and the accelerating voltage of the present example is 100 keV. Also, the implanted dopants are laser-annealed at 900° C. for 30 minutes.

The SIMS analysis result of the present example shows that the diffusion coefficient of aluminum is higher than the diffusion coefficient of boron. For this reason, the junction depth of aluminum Xj=2.37 μm is larger than the junction depth of boron Xj=1.15 μm. As mentioned above, when the same dosage and the same accelerating voltage are used, it is understood that aluminum having a higher diffusion coefficient can form a deeper collector layer than boron having a lower diffusion coefficient can.

Figure 7:
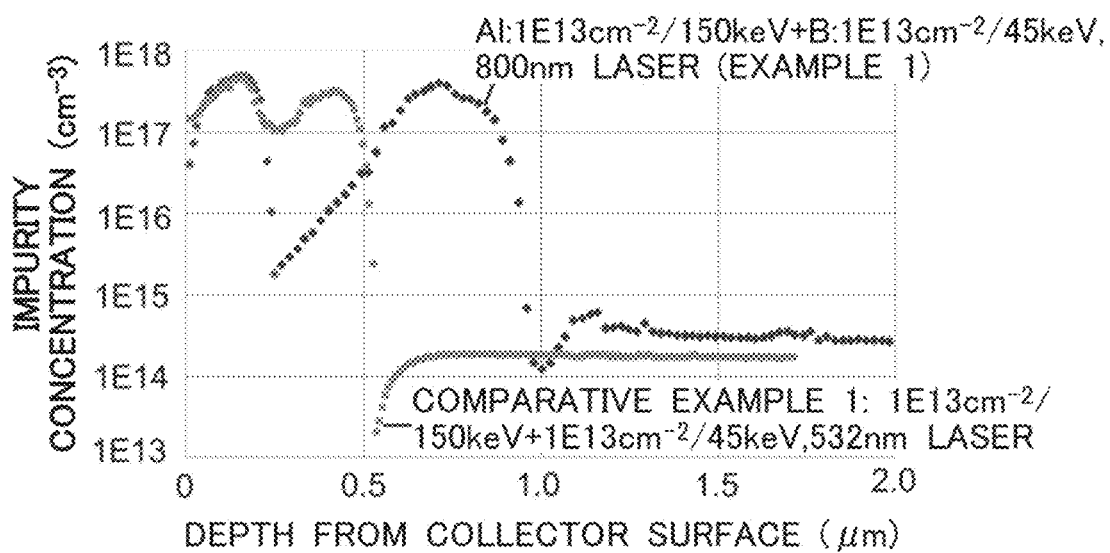
FIG. 7 shows impurity concentration distributions of the collector layer 50 according to Example 1 and Comparative Example 1.

FIG. 7 shows impurity concentration distributions of the collector layer 50 according to Example 1 and Comparative Example 1. The longitudinal axis shows an impurity concentration ($cm^{-3}$), and the horizontal axis shows a depth (μm) from the ion implantation surface of the collector layer 50. The impurity concentration distributions of the present example are calculated from simulation. In addition, a layer having the impurity concentration from $1\times10^{14}$ to $1\times10^{15}$ shows the base layer 40.

In Comparative Example 1, boron is ion-implanted as the first dopant and the second dopant. Regarding the first dopant, boron is ion-implanted at a dosage of $1.0\times10^{13}$ $cm^{-2}$ and an accelerating voltage of 150 keV. Also, regarding the second dopant, boron is ion-implanted at a dosage of $1.0\times10^{13}$ $cm^{-2}$ and an accelerating voltage of 45 keV. In Comparative Example 1, each dopant is activated by laser annealing in which a laser having a wavelength of 532 nm is used. The collector layer 50 according to Comparative Example 1 has a shallow depth of 0.5 μm, and reverse leakage current increases if a scratch or an alloy spike occurs during the wafer process or the module assembling step.

The impurity concentration according to Comparative Example 1 has a first impurity concentration peak and a second impurity concentration peak according to a difference in the accelerating voltages. The first impurity concentration peak corresponds to the boron implanted at an accelerating voltage of 45 keV, and is present at the depth of 0 μm to 0.25 μm from the ion implantation surface. The second impurity concentration peak corresponds to the boron implanted at an accelerating voltage of 150 keV, and is present at the depth of 0.25 μm to 0.5 μm from the ion implantation surface of the collector layer 50.

In Example 1, boron is ion-implanted as the first dopant and aluminum is ion-implanted as the second dopant. In the present example, aluminum is ion-implanted at a dosage of $1.0\times10^{13}$ $cm^{-2}$ and an accelerating voltage of 150 keV. Also, boron is ion-implanted at a dosage of $1.0\times10^{13}$ $cm^{-2}$ and an accelerating voltage of 45 keV. In Example 1, both aluminum and boron are ion-implanted, and thus the collector layer 50 can be formed thicker compared to a case in which only boron is ion-implanted. Also, by ion-implanting both aluminum and boron, it is possible to prevent a decrease in the impurity concentration near the ion implantation surface of the collector layer 50 compared to a case in which only aluminum is ion-implanted. Thereby, in the method according to Example 1, variations of an on-voltage Von can be reduced.

Also, in Example 1, each dopant is activated by laser annealing in which a laser with a wavelength of 800 nm is used. By using a laser having a longer wavelength than that of Comparative Example 1, heat can reach a deeper region, and thus the impurities can be diffused sufficiently. Thereby, for example, the depth of the collector layer 50 can be deepened to 1.0 μm or more. Furthermore, the collector layer 50 can be made thicker by increasing the accelerating voltage of aluminum ion during the activation. Also, the collector layer 50 of the present example recovers damages caused by ion implantation in the deep region by allowing the heat to reach a deep region of the collector layer 50. For this reason, a high-quality collector layer 50 can be provided.

The impurity concentration according to Example 1 has a first impurity concentration peak and a second impurity concentration peak according to a difference in the types of dopants and the accelerating voltages. The first impurity concentration peak is closer to the ion implantation surface of the collector layer 50 than the second impurity concentration peak is. The positions of the first impurity concentration peak and the second impurity concentration peak are determined to be any depth according to the conditions under which the ion implantation and the diffusion take place.

The first impurity concentration peak corresponds to boron implanted at an accelerating voltage of 45 keV and is present at the depth of 0 μm to 0.25 μm from the ion implantation surface of the collector layer 50. The first impurity concentration peak of the present example has magnitude of $1.0\times10^{17}$ or more. More preferably, the first impurity concentration peak has magnitude of $1.0\times10^{19}$ or more.

The second impurity concentration peak corresponds to aluminum implanted at an accelerating voltage of 150 keV and is present at the depth of 0.5 μm to 1.0 μm from the ion implantation surface of the collector layer 50. The second impurity concentration peak of the present example has magnitude of $1.0\times10^{17}$ or more. Also, the second impurity concentration peak may be more than 100 times as high as the impurity concentration of the base layer 40. For example, the second impurity concentration peak of the present example has a value of $1.0\times10^{17}$ or more, whereas the impurity concentration of the base layer 40 is $1.0\times10^{15}$ or less.

In Example 1, a layer having a low impurity concentration may be present between the first impurity concentration peak and the second impurity concentration peak. For example, the collector layer 50 has a layer having an impurity concentration of $1.0\times10^{16}$ or less between the first impurity concentration peak and the second impurity concentration peak. Also, the collector layer 50 may have a layer having an impurity concentration with magnitude which is $1/10$ or less of the first impurity concentration peak between the first impurity concentration peak and the second impurity concentration peak.

Example 2

Figure 8:
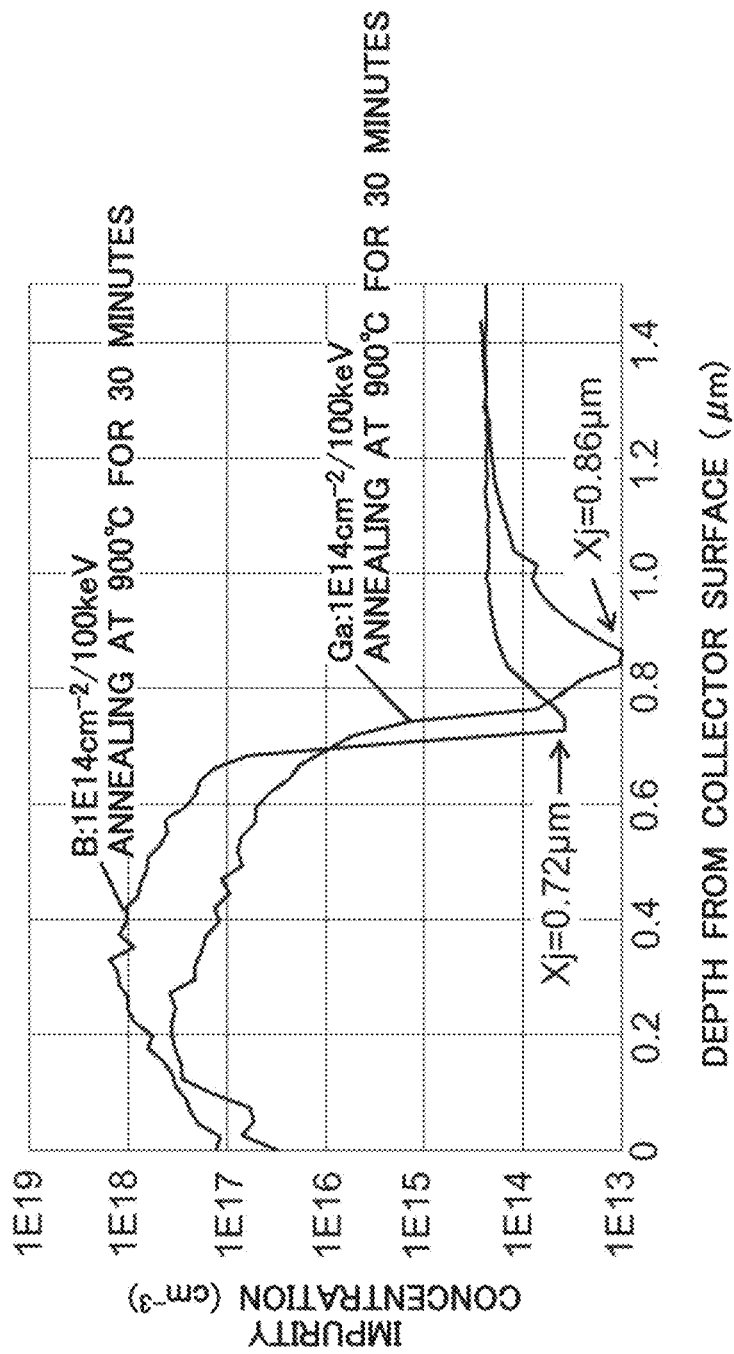
FIG. 8 shows an SIMS analysis result of impurity concentration distributions of boron and gallium according to Example 2.

FIG. 8 shows an SIMS analysis result of impurity concentration distributions of boron and gallium according to Example 2. The longitudinal axis shows an impurity concentration ($cm^{-3}$), and the horizontal axis shows a depth (μm) from the ion implantation surface of the collector layer 50. In the present example, the ion implantation surface refers to the surface through which the dopants are ion-implanted. The impurity concentration distributions of the present example are impurity concentration distributions showing a case in which boron and gallium are ion-implanted into a silicon wafer.

The dopants of the present example are ion-implanted at the same dosage and the same accelerating voltage, and are laser-annealed under the same conditions. That is, a difference in the diffusion coefficients between boron and gallium can be found by comparing the impurity concentration distributions of boron and gallium which are ion-implanted and diffused under the same conditions. The dosage of the present example is $1.0\times10^{14}$ $cm^{-2}$ and the accelerating voltage of the present example is 100 keV. Also, the implanted dopants are laser-annealed at 900° C. for 30 minutes.

The SIMS analysis result of the present example shows that the diffusion coefficient of gallium is higher than the diffusion coefficient of boron. That is, the junction depth of gallium Xj=0.86 μm is larger than the junction depth of boron Xj=0.72 μm. Therefore, it is understand that when the same dosage and the same accelerating voltage are used, gallium having a higher diffusion coefficient can form a deeper collector layer than boron having a lower diffusion coefficient can.

Figure 9:
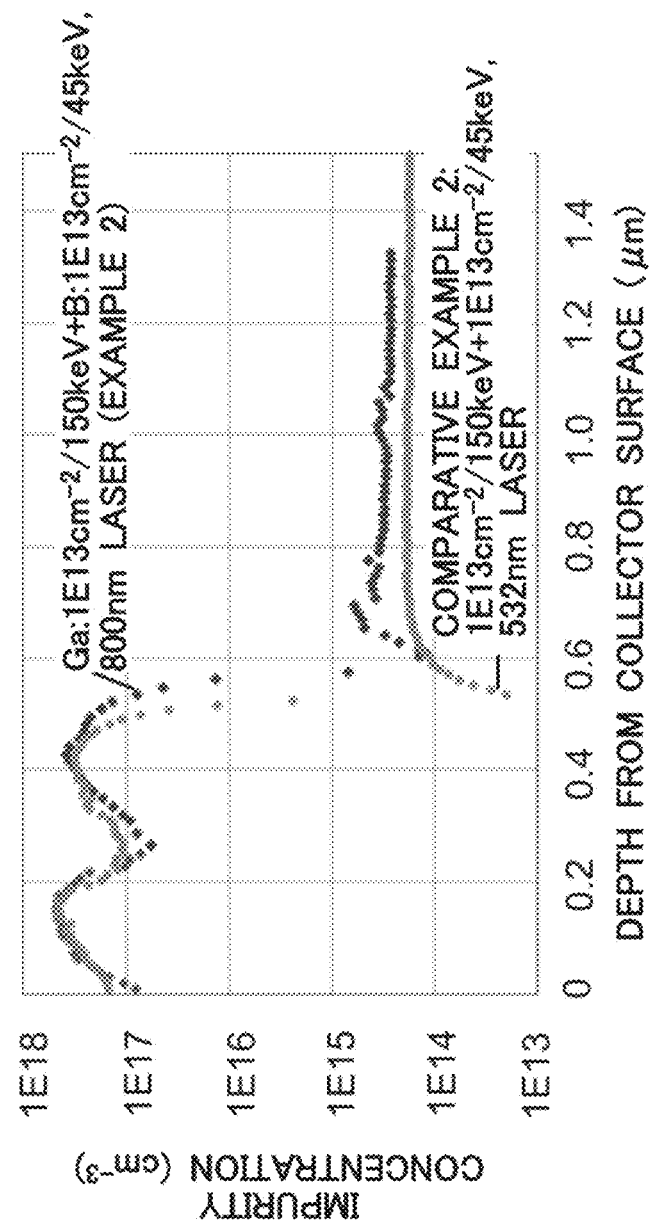
FIG. 9 shows impurity concentration distributions of the collector layer 50 according to Example 2 and Comparative Example 2.

FIG. 9 shows impurity concentration distributions of the collector layer 50 according to Example 2 and Comparative Example 2. The longitudinal axis shows an impurity concentration ($cm^{-3}$), and the horizontal axis shows a depth (μm) from the ion implantation surface of the collector layer 50. The impurity concentration distributions of the present example are calculated from simulation. In addition, a layer having an impurity concentration from $1 \times 10^{14}$ to $1 \times 10^{15}$ is the base layer 40. The conditions according to Comparative Example 2 are the same as the conditions according to Comparative Example 1 shown in FIG. 7.

In Example 2, boron is ion-implanted as the first dopant, and gallium is ion-implanted as the second dopant. In the present example, gallium is ion-implanted at a dosage of $1.0 \times 10^{13} cm^{-2}$ and an accelerating voltage of 150 keV. Also, boron is ion-implanted at a dosage of $1.0 \times 10^{13} cm^{-2}$ and an accelerating voltage of 45 keV. In Example 2, both gallium and boron are ion-implanted, and thus the collector layer 50 can be formed thicker compared to the case in which only boron is ion-implanted. Also, by ion-implanting both gallium and boron, it is possible to prevent a decrease in the impurity concentration near the ion implantation surface of the collector layer 50 compared to a case in which only gallium is ion-implanted. Thereby, in the method according to Example 2, variations of an on-voltage Von can be reduced.

Also, in Example 2, each dopant is activated by laser annealing in which a laser with a wavelength of 800 nm is used. By using a laser having a longer wavelength than that of Comparative Example 2, heat can reach a deeper region, and thus the impurities can be diffused sufficiently. Thereby, for example, the depth of the collector layer 50 can be deepened to 0.6 μm or more. Furthermore, the collector layer 50 can be made thicker by increasing the accelerating voltage of gallium ions during the activation. Also, the collector layer 50 of the present example recovers from damages caused by ion implantation in a deep region of the collector layer by allowing the heat to reach the deep region of the collector layer 50. For this reason, a high-quality collector layer 50 can be provided.

The impurity concentration according to Example 2 has a first impurity concentration peak and a second impurity concentration peak according to a difference in the types of the dopants and the accelerating voltages. The first impurity concentration peak is closer to the ion implantation surface of the collector layer 50 than the second impurity concentration peak is. The positions of the first impurity concentration peak and the second impurity concentration peak are determined to be any depth according to the conditions under which the ion implantation and the diffusion take place.

The first impurity concentration peak corresponds to boron implanted at an accelerating voltage of 45 keV and is present at the depth of 0 μm to 0.25 μm from the ion implantation surface of the collector layer 50. The first impurity concentration peak of the present example has magnitude of $1.0 \times 10^{17}$ or more. More preferably, the first impurity concentration peak has magnitude of $1.0 \times 10^{19}$ or more.

The second impurity concentration peak corresponds to gallium implanted at an accelerating voltage of 150 keV. The second impurity concentration peak of the present example has magnitude of $1.0 \times 10^{17}$ or more. Also, the second impurity concentration peak may be more than 100 times as high as the impurity concentration of the base layer 40. For example, the second impurity concentration peak of the present example has a value of $1.0 \times 10^{17}$ or more, whereas the impurity concentration of the base layer 40 is $1.0 \times 10^{15}$ or less.

Example 3

Figure 10:
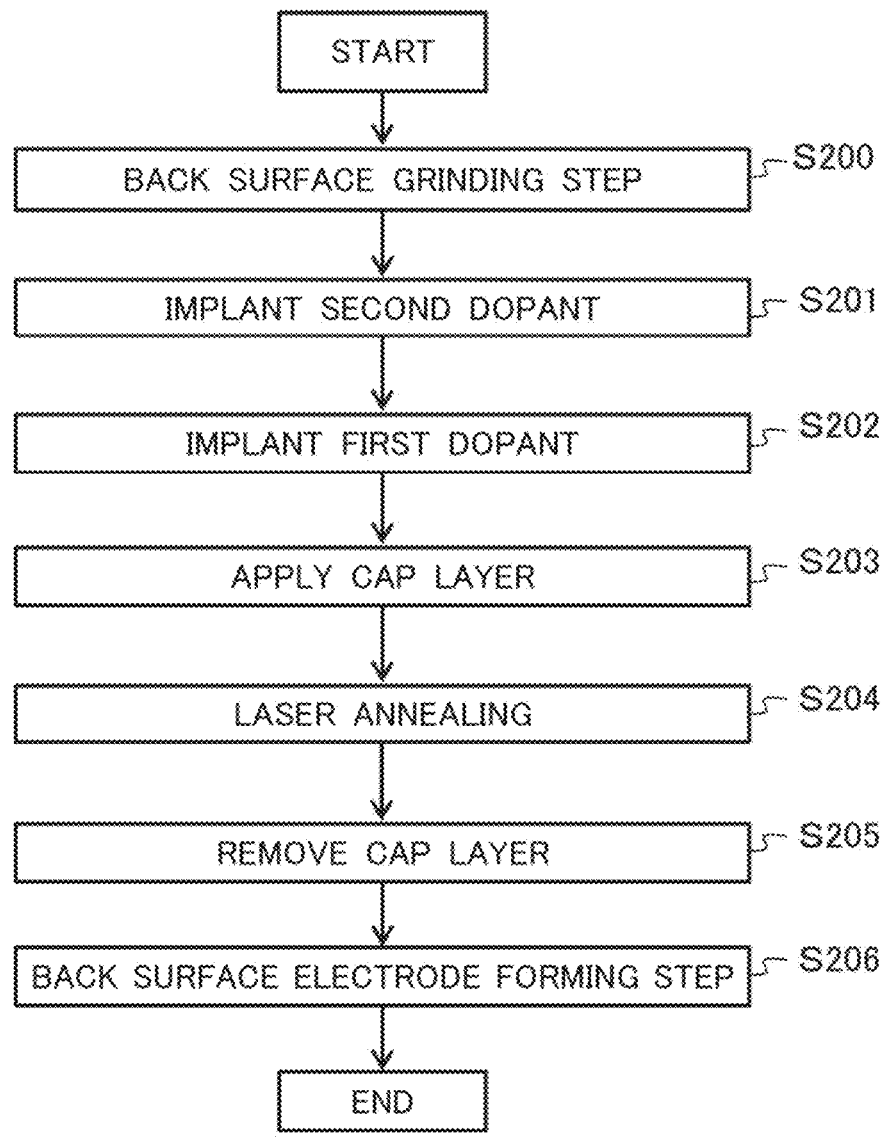
FIG. 10 shows one example of a step of manufacturing the collector layer 50 according to Example 2.

FIG. 10 shows one example of a step of manufacturing the collector layer 50 according to Example 3. The manufacturing step of the present example has a step of applying a cap layer as a protective film.

In step S200, the rear surface of the base substrate 42 is ground to control the thickness of the base substrate 42 to be equal to a predetermined thickness. In step S201, the second dopant is ion-implanted. In the present example, as the second dopant, aluminum is ion-implanted at a dosage of $1.0 \times 10^{13} cm^{-2}$ and an accelerating voltage of 150 keV. Also, gallium may be used as the second dopant. In step S202, the first dopant is ion-implanted. The accelerating voltage of the first dopant may be lower than the accelerating voltage of the second dopant. In the present example, as the first dopant, boron is ion-implanted at a dosage of $1.0 \times 10^{13} cm^{-2}$ and an accelerating voltage of 45 keV.

In step S203, a cap layer is formed on the rear surface side of the collector layer 50. An outward diffusion of aluminum due to its vaporization can be suppressed during laser annealing by forming the cap layer on the rear surface of the collector layer 50. It is preferable that the cap layer is applied to the front surface of the collector layer 50 after ion implantation. It is because, if ion implantation is performed after the cap layer is formed, control of a depth direction of the ion implantation is affected by the cap layer.

In step S204, laser annealing is performed from the rear surface side of the collector layer 50. A laser having a wavelength of 800 nm is used for laser annealing. In step S205, the cap layer is removed. After that, in step S206, the collector electrode 70 is formed on the rear surface side of the collector layer 50 from which the cap layer is removed.

Figure 11A:
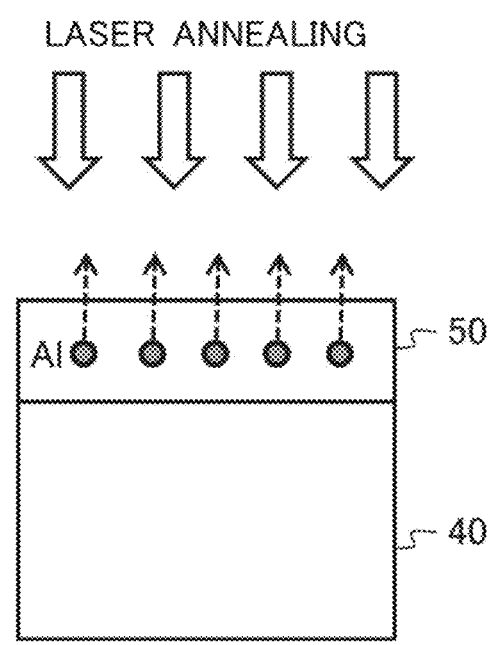
FIG. 11A shows a laser annealing step when the cap layer is not used.

FIG. 11A shows a step of laser annealing when the cap layer is not used. In the present example, the cap layer is not formed on the collector layer 50, and thus aluminum diffuses outward by the laser annealing step.

Figure 11B:
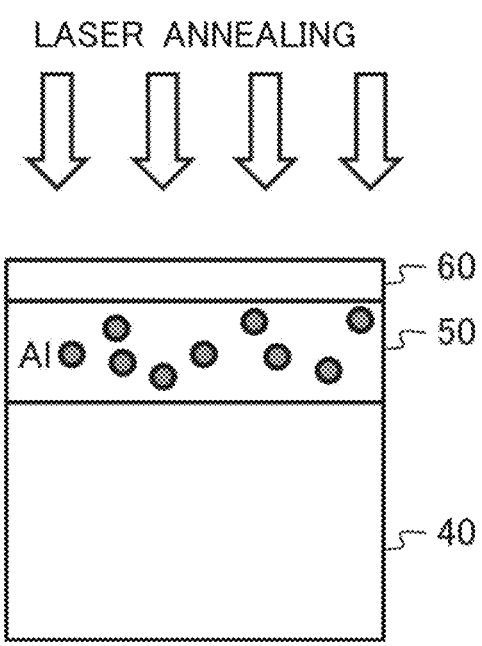
FIG. 11B shows a laser annealing step when the cap layer is used.

FIG. 11B shows a laser annealing step when the cap layer 60 is used. In the present example, the cap layer 60 is formed on the collector layer 50, and thus an outward diffusion of aluminum by the laser annealing step is suppressed. By suppressing the outward diffusion of aluminum, it is easier to control the impurity concentration in the collector layer 50 to be equal to a predetermined concentration.

The cap layer 60 is a protective film formed by using materials such as $SiO_2$ and SiN. More specifically, the material of the cap layer 60 is a spin-on-glass film (SOG film) applied by spin coating. Also, the film thickness of the cap layer 60 is 30 nm or more, and preferably 60 nm or more and 600 nm or less. In addition, the material and the film thickness of the cap layer are not limited thereto as long as a condition capable of suppressing the outward diffusion of aluminum is fulfilled. In addition, the case of Example 1 has been described in the present example. However, in the case according to Example 2, the outward diffusion of gallium may be suppressed using the cap layer 60.

Figure 12A:
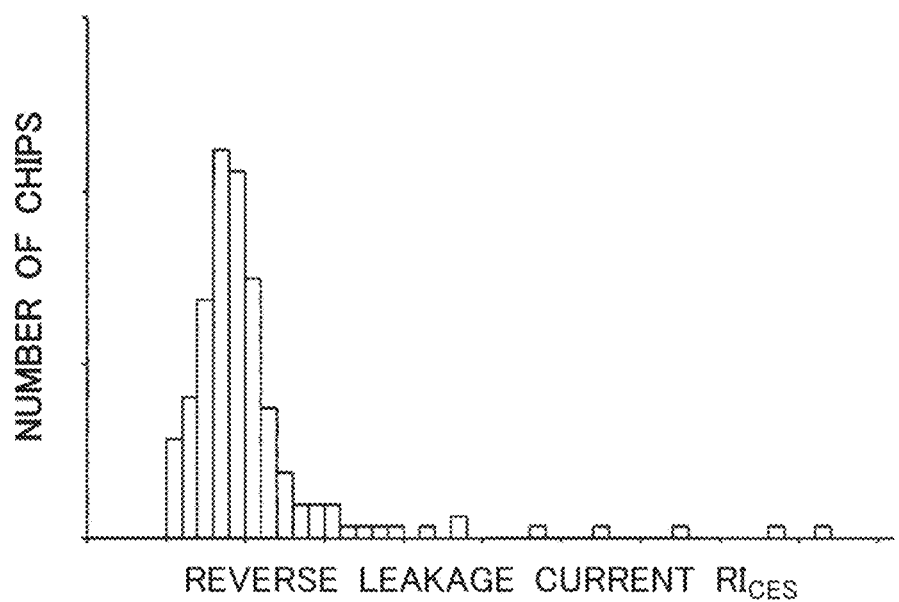
FIG. 12A shows a comparative example of a histogram of reverse leakage current.

FIG. 12A shows a comparative example of a histogram of reverse leakage current. The longitudinal axis shows the number of chips and the horizontal axis shows reverse leakage current $RI_{ces}$. The semiconductor device of the present example has a collector layer having a thickness of 0.25 μm.

Figure 12B:
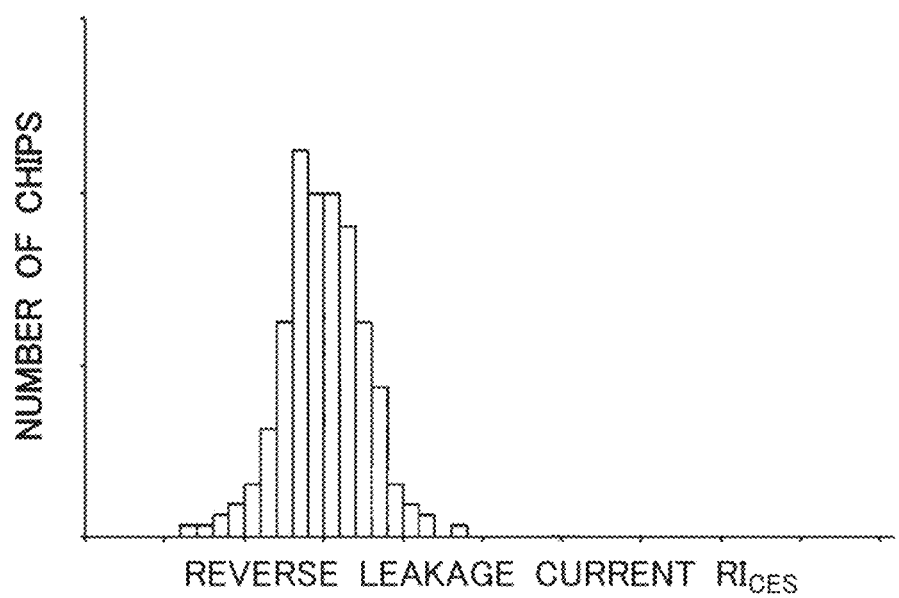
FIG. 12B shows the comparative example of the histogram of the reverse leakage current.

FIG. 12B shows one example of the histogram of reverse leakage current. The semiconductor device 100 of the present example has a collector layer 50 having a thickness of 0.55 μm. Boron is ion-implanted to form a contact at a dosage of $1.0 \times 10^{13}$ cm$^{-2}$ and an accelerating voltage of 45 keV. In addition, the class of breakdown voltage of the semiconductor device in FIG. 12A and FIG. 12B is 700 V. As shown in FIG. 12A and FIG. 12B, by providing a p type collector layer 50 with sufficient thickness, scratch resistance improves, and a high yield rate can be achieved. In the semiconductor device 100 of the present example, the number of elements with high reverse leakage current is reduced by deepening the depth of the collector layer 50. It is because deepening the depth of the collector layer 50 makes the semiconductor device 100 less affected by a deficiency of the collector layer 50, and thus the p-n junction is formed stably.

Figure 13:
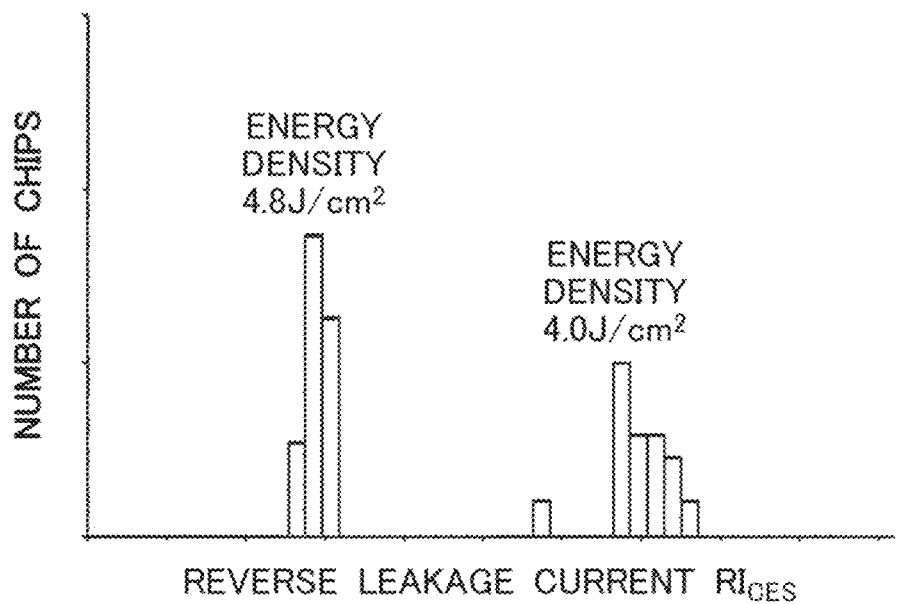
FIG. 13 shows an energy density dependence of the reverse leakage current.

FIG. 13 shows energy density dependence of the reverse leakage current. The longitudinal axis shows the number of chips, and the horizontal axis shows reverse leakage current $RI_{ces}$. Also, in the present example, magnitude of an energy density during laser annealing is changed to 4.0 J/cm$^2$ and 4.8 J/cm$^2$. In addition, as the first dopant, boron is ion-implanted at a dosage of $1.0 \times 10^{13}$ cm$^{-2}$ and an accelerating voltage of 45 keV, and as the second dopant, boron is ion-implanted at a dosage of $1.0 \times 10^{13}$ cm$^{-2}$ and an accelerating voltage of 520 keV. Also, a semiconductor laser having a wavelength of 800 nm is used for laser annealing of the present example.

The energy density refers to energy supplied per unit area during laser annealing. The present example succeeded in reducing an on-voltage Von (V) by approximately 0.3 V by increasing the energy density from 4.0 J/cm$^2$ to 4.8 J/cm$^2$. In addition, the magnitude of the energy density may be appropriately changed according to properties the semiconductor device 100 is required to have. For example, the energy density is 4.0 J/cm$^2$ or more. More preferably, the energy density is 4.5 J/cm$^2$ or more, and 5.0 J/cm$^2$ or less.

Figure 14:
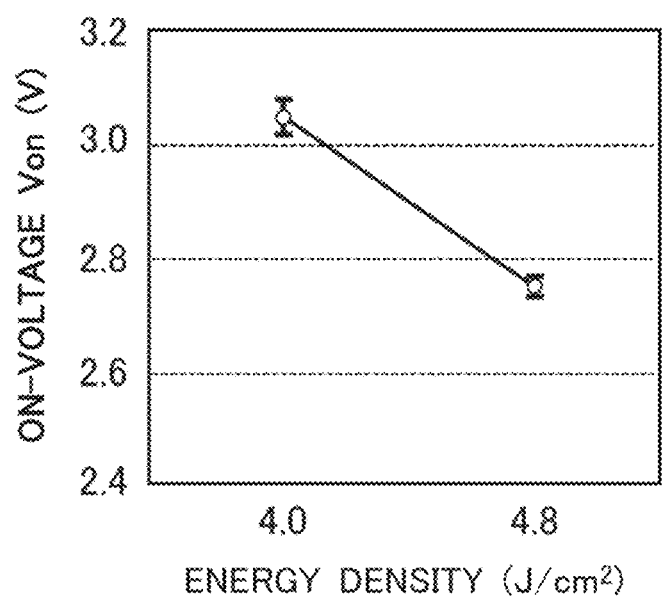
FIG. 14 shows the energy density dependence of an on-voltage.

FIG. 14 shows the energy density dependence of the on-voltage. The longitudinal axis shows the on-voltage Von (V), and the horizontal axis shows the energy density (J/cm$^2$).

By increasing the energy density during laser annealing, an activation ratio of the dopant increases, and defects in the semiconductor are restored. Thereby, there are less variations of the on-voltage Von by increasing the energy density during laser annealing. In addition, the on-voltage Von becomes low by increasing the energy density during laser annealing.

As mentioned above, the semiconductor device 100 according to the present specification has a collector layer formed thicker than that of the conventional technique. Thereby, the semiconductor device 100 can prevent a spike or the like from penetrating through the collector layer and entering into the p-n junction, suppress an increase in the leakage current and a decrease in the reverse breakdown voltage, and obtain a high breakdown voltage yield rate.

While the embodiments of the present invention have been described, the technical scope of the present invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A manufacturing method, comprising:
    forming a base layer of a first conductivity type having a MOS gate structure formed on a front surface side thereof;
    forming, on a rear surface side of the base layer, a collector layer of a second conductivity type including a first dopant and a second dopant which is a different element from the first dopant, the first dopant and the second dopant both being second conductivity type impurities; and
    forming a collector electrode on a rear surface side of the collector layer,
    wherein an impurity concentration peak of the second dopant is at a deeper position from the rear surface of the collector layer than an impurity concentration peak of the first dopant, and magnitude of the impurity concentration peak of the second dopant is more than $\frac{1}{100}$ of magnitude of the impurity concentration peak of the first dopant.

2. The manufacturing method according to claim 1, wherein forming the collector layer comprises ion-implanting the first dopant and the second dopant with an energy density of 4.0 J/cm$^2$ or more.

3. The manufacturing method according to claim 1, wherein forming the collector layer comprises:
    ion-implanting the first dopant and the second dopant;
    forming a protective film on the rear surface side of the collector layer; and
    performing laser annealing from the rear surface side of the collector layer.

4. The manufacturing method according to claim 3, wherein a wavelength of a laser used for the laser annealing is 800 nm or more.

5. The manufacturing method according to claim 1, wherein the second dopant is aluminum, and the second dopant is ion-implanted at an accelerating voltage of 150 keV.

6. The manufacturing method according to claim 1, wherein the second dopant is gallium, and the second dopant is ion-implanted at an accelerating voltage of 150 keV.

7. The manufacturing method according to claim 1, wherein
    forming the base layer of the first conductivity type having the MOS gate structure formed on the front surface side thereof includes thinning a base substrate to form the base layer before forming the MOS gate structure.

8. The manufacturing method according to claim 1, further comprising
thinning the base layer having the MOS gate structure from the rear surface of the base layer.

9. The manufacturing method according to claim 1, wherein
forming the collector layer includes forming the collector layer directly on the rear surface side of the base layer.

* * * * *